(12) United States Patent
Burgess et al.

(10) Patent No.: US 9,728,432 B2
(45) Date of Patent: Aug. 8, 2017

(54) METHOD OF DEGASSING

(71) Applicant: SPTS TECHNOLOGIES LIMITED, Newport (GB)

(72) Inventors: Stephen R Burgess, Gwent (GB); Anthony Paul Wilby, Bristol (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 14/950,879

(22) Filed: Nov. 24, 2015

(65) Prior Publication Data

US 2016/0155652 A1    Jun. 2, 2016

(30) Foreign Application Priority Data

Nov. 28, 2014 (GB) .................................. 1421151.0

(51) Int. Cl.
  *H01L 21/67* (2006.01)
  *H01L 21/677* (2006.01)
  *F24C 7/04* (2006.01)
  *H01L 21/324* (2006.01)

(52) U.S. Cl.
  CPC .......... *H01L 21/67276* (2013.01); *F24C 7/04* (2013.01); *H01L 21/324* (2013.01); *H01L 21/67017* (2013.01); *H01L 21/6719* (2013.01); *H01L 21/67109* (2013.01); *H01L 21/67748* (2013.01)

(58) Field of Classification Search
  CPC ......... H01L 21/67276; H01L 21/67109; H01L 21/67115; H01L 21/67167; H01L 21/6719; H01L 21/67201; H01L 21/02041; H01L 21/67017; H01L 21/67207; H01L 21/67748; H01L 21/324
  See application file for complete search history.

(56) References Cited

U.S. PATENT DOCUMENTS 5,380,682 A * 1/1995 Edwards ............... G01J 5/0003
                                                          29/25.01
5,925,227 A    7/1999 Kobayashi et al.
(Continued)

FOREIGN PATENT DOCUMENTS

WO    WO2009079845 A1    7/2009

OTHER PUBLICATIONS

Search Report in Corresponding European Applicatoin 15196880.7-1551 Dated Apr. 11, 2016.

*Primary Examiner* — Michael Trinh
(74) *Attorney, Agent, or Firm* — Volentine & Whitt, PLLC

(57) ABSTRACT

A method of degassing semiconductor substrates includes sequentially loading a plurality of semiconductor substrates into a degas apparatus, and degassing the semiconductor substrates in parallel, the degassing of each semiconductor substrate commencing at a different time related to the time at which the semiconductor substrate was loaded into the degas apparatus. The method further includes unloading a semiconductor substrate from the degas apparatus when the semiconductor substrate has been degassed, while semiconductor substrates which were loaded later in the sequence are still being degassed. The degassing of the semiconductor substrates is performed at pressure of less than $10^{-4}$ Torr, and the degas apparatus is pumped continuously during the degassing of the semiconductor substrates.

13 Claims, 7 Drawing Sheets

(56) References Cited

U.S. PATENT DOCUMENTS

| | | | | |
|---|---|---|---|---|
| 6,497,734 B1* | 12/2002 | Barber | ............ | H01L 21/67017 |
| | | | | 29/25.01 |
| 8,563,424 B2* | 10/2013 | Ganguli | ................. | C23C 16/18 |
| | | | | 438/630 |
| 2010/0196599 A1* | 8/2010 | Ponnekanti | ......... | H01L 21/6719 |
| | | | | 427/248.1 |

* cited by examiner

METHOD OF DEGASSING

BACKGROUND

This invention relates to a method of degassing a plurality of semiconductor substrates, and to associated apparatus.

The fabrication of semiconductor devices is performed under carefully controlled conditions where it is generally necessary to maintain low levels of impurities. One potential source of impurities is the semiconductor wafer to be processed. Accordingly, it is well known to perform a degassing procedure on a semiconductor wafer prior to one or more fabrication process steps. For example, semiconductor device fabrication processes frequently use techniques for depositing thin layers of high purity materials on to a substrate. It is very important that during these processes, the process chamber is kept free of contaminants so that the deposited film has the required properties. Many standard industry techniques such as PVD and CVD operate under vacuum conditions. It is important that a low pressure is maintained so that minimal contamination of the deposited films occurs.

Many modern production methods require the use of substrates that are coated with materials that may outgas very heavily when exposed to heat. Examples of such materials include organic passivation layers, adhesives, photoresists or spin-on materials. In addition, novel substrate materials are increasingly being used that outgas significantly. Within the wafer packaging industry, materials such as polyimide (PI) and polybenzoxazole (PBO) which are especially problematic. When materials such as these outgas, contaminants are released into the process tool and are incorporated into a growing film. This can cause substantial problems. For example, the properties and characteristics of the deposited films can be degraded.

Cluster tools are commonly used for cost effective manufacture of semiconductor wafers. Typically, wafers are transported from cassettes or Front Opening Unified Pods (FOUPs) into a transport module which operates at a low pressure. One or more robots within the transport module move wafers from the cassettes/FOUPs to numerous modules positioned close to the transport module. The modules which are positioned around the transport module typically operate under vacuum conditions and each have dedicated functions such as degas, etch, PVD deposition amongst other functions.

It is common to degas semiconductor substrates in a dedicated degas process module prior to a subsequent process step such as deposition as part of a standard process flow. It is known to provide degas modules in which a single wafer is degassed at a time. Batch degas modules are also known. In these arrangements, a number of wafers are loaded and degassed together. However, many novel materials used within the semiconductor industry have extremely low rates of degassing which leads to long degas times of 30 minutes or more. However, it is important to achieve a high throughput of any commercial process equipment so that the associated fixed cost can be minimised on a per wafer basis. As a result, it may not be economically viable to process substrates which outgas heavily, because the low degas rates and long degas times can result in a throughput which is too low to be commercially acceptable.

SUMMARY

The present invention, in at least some of its embodiments, addresses one or more of the above mentioned problems. Although the invention is particularly applicable to semiconductor substrates which include heavily outgassing materials such as PBO and PI, the invention is applicable widely to all kinds of semiconductor substrates.

According to a first aspect of the invention there is provided a method of degassing semiconductor substrates comprising:

sequentially loading a plurality of semiconductor substrates into a degas apparatus;

degassing the semiconductor substrates in parallel, the degassing of each semiconductor substrate commencing at a different time related to the time at which the semiconductor substrate was loaded into the degas apparatus; and unloading a semiconductor substrate from the degas apparatus when the semiconductor substrate has been degassed, while semiconductor substrates which were loaded later in the sequence are still being degassed;

in which the degassing of the semiconductor substrates is performed at a pressure of less than $10^{-4}$ Torr, and the degassing apparatus is pumped continuously during the degassing of the semiconductor substrates.

In this way, substantial improvements in throughput can be obtained. It is possible to load and unload semiconductor substrates whilst other semiconductor substrates are undergoing degassing. This can be done without contamination to semiconductor substrates undergoing degassing.

The degassing of the semiconductor substrates may be performed at a pressure of less than $5 \times 10^{-5}$ Torr.

The degassing may comprise radiatively heating the semiconductor substrates.

The semiconductor substrates may be heated to any desired temperature. Typically, the semiconductors substrates may be heated to 100° C. or more.

Each semiconductor substrate may be degassed for a predetermined amount of time prior to unloading. It is believed that this is the most practical way of determining when the semiconductor substrate has been degassed. The predetermined amount of time may be set by a user. The predetermined amount of time may be determined empirically based on the characteristics of the degas apparatus and of the semiconductor substrates. In principle, some form of monitoring might instead be used to determine when a semiconductor substrate has been degassed.

At least three semiconductor substrates may be sequentially loaded into the degas apparatus. Preferably, at least 20 semiconductor substrates are sequentially loaded into the degas apparatus. More preferably, at least 50 semiconductor substrates may be sequentially loaded into the degas apparatus.

The degas apparatus may comprise a degas module. The degas module may form part of a cluster tool for processing semiconductor substrates.

The semiconductor substrates may be semiconductor wafers, such as silicon semiconductor wafers. It will be understood that the semiconductor substrates may comprise additional, non-semiconductor, elements.

According to a second aspect of the invention there is provided a method of degassing semiconductor substrates comprising:

loading a first semiconductor substrate into a degas apparatus;

performing a degas process on the first semiconductor substrate;

loading a second semiconductor substrate in to the degas apparatus while the degas process is being performed on the first semiconductor substrate;

performing a degas process on the second semiconductor substrate; and unloading the first semiconductor substrate from the apparatus on completion of its degas process while the second semiconductor substrate is still undergoing its degas process;

in which the degas processes are performed at a pressure of less than $10^{-4}$ Torr, and the degas apparatus is pumped continuously during the degassing of semiconductor substrates.

Further semiconductors may be loaded into the degas apparatus while the degas process is being performed on the first and/or second semiconductor substrates.

According to a third aspect of the invention there is provided a degas apparatus for degassing semiconductor substrates comprising:

a loading and unloading device for sequentially loading and unloading semiconductor substrates into and from the degas apparatus;

a pumping arrangement for pumping the degas apparatus to achieve a desired pressure for degassing the semiconductor substrates, wherein the desired pressure is less than $10^{-4}$ Torr; and a controller which permits the semiconductor substrates to be loaded sequentially and degassed in parallel, the degassing of each semiconductor substrate commencing at a different time related to the time at which the semiconductor substrate was loaded into the degas apparatus, wherein the controller determines that a semiconductor substrate has been degassed and causes the degas semiconductor substrate to be unloaded from the degas apparatus while semiconductor substrates which were loaded later in the sequence are still being degassed;

in which the apparatus is configured so that the pumping arrangement continuously pumps the degas apparatus during the degassing of the semiconductor substrates.

The degas apparatus may further comprise one or more radiative heaters for radiatively heating the semiconductor substrates. The radiative heaters may be lamps.

The pumping arrangement may comprise a cryopump. The volume of the degas apparatus may be selected so that is in conjunction with the pumping arrangement, it is possible to achieve the desired pressure vacuum level whilst semiconductor substrates are loaded and unloaded into and from the degas apparatus. The desired pressure may be less than $5 \times 10^{-5}$ Torr.

The controller may determine that a semiconductor substrate has been degassed once semiconductor substrate has been degassed for a predetermined period of time. As noted above, this is believed to be the most practical way in which it can be determined when a semiconductor substrate has been degassed. The controller may comprise a timer functionality which monitors the time that each semiconductor substrate is subjected to degassing. The timer functionality may provide a condition indicator once a semiconductor substrate has been degassed for the predetermined period of time. The condition indicator may directly or indirectly cause the degas semiconductor substrate to be unloaded from the degas apparatus.

The loading and unloading device may comprise a slot through which semiconductor substrates can be loaded and unloaded into and from the degas apparatus. The loading and unloading device may further comprise a suitable substrate transport mechanism as is well known in the art.

The degas apparatus may further comprise a structure onto which the semiconductor substrates can be loaded. The structure may be a cassette. The cassette may be a vertically aligned cassette enabling a semiconductor substrate to be stacked in a vertical arrangement.

The degas apparatus may comprise a degas module. The semiconductor substrates may be degassed in the degas module. The degas apparatus may further comprise a semiconductor substrate transport module. The degas module and the semiconductor substrate transport module may form part of a cluster tool for processing semiconductor substrates. The relatively low pressure maintained in the degas apparatus has the benefit that the vacuum in the transport module is not compromised. This in turn helps to avoid cross contamination of the other process modules in the cluster tool.

According to a fourth aspect of the invention there is provided a cluster tool for processing semiconductor substrates comprising a degas apparatus of the third aspect of the invention. The degas apparatus may comprise a degas module and a semiconductor substrate transport module.

Whilst the invention has been described above, it extends to any inventive combination of the features set out above, or in the following description, drawings or claims. For example, any feature described in relation to one aspect of the invention is considered to be disclosed in relation to any other aspect of the invention.

BRIEF DESCRIPTION OF THE DRAWINGS

Embodiments of degas apparatus and methods of degassing will now be described with reference to the accompanying drawings, in which.

DETAILED DESCRIPTION OF EMBODIMENTS

Figure 1:
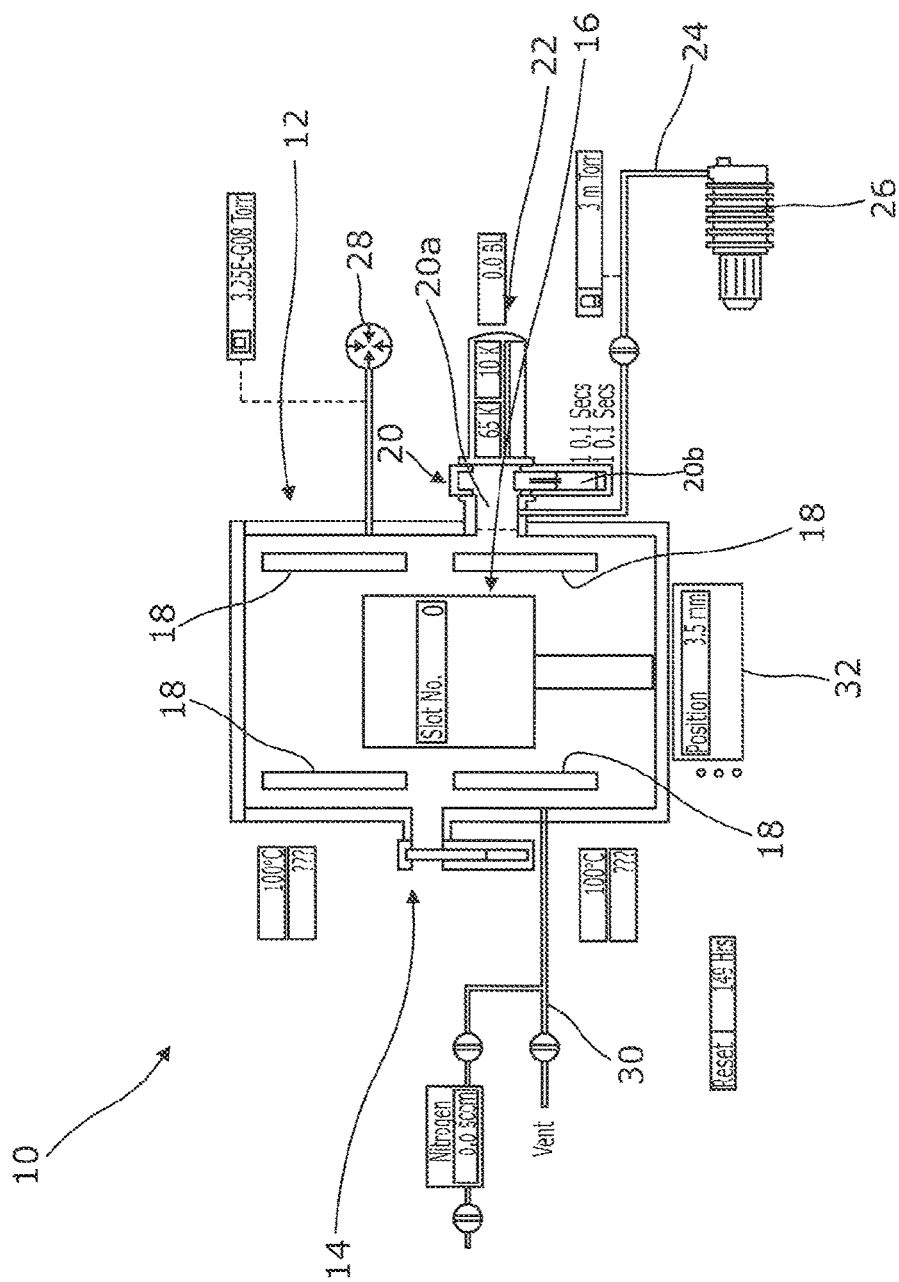
FIG. 1 shows a degas apparatus of the invention with a cutaway view of the chamber.

FIG. 1 shows a degas module, depicted generally at 10, of the invention. The degas module 10 comprises a chamber 12 having an opening 14 in the form of a slot valve through which wafers can be loaded into and unloaded from the module 10. The chamber 12 contains a wafer holder 16 which can hold multiple wafers at the same time. The wafer holder 16 may be in the form of a cassette which enables a vertical stacking of the wafers. The wafer holder 16 comprises a lift assembly which enables a desired slot in the wafer holder 16 to be aligned with the opening 14 so that a wafer can be either loaded into or unloaded from the slot. The chamber 12 also contains plurality of lamps 18 which provide radiative heating of the wafers held in the wafer holder 16. The chamber 12 further comprises a pumping port 20 which is connected to a suitable pumping arrangement. The pumping port 20 comprises an opening 20a in the chamber 12 and a gate valve 20a. In the embodiment shown in FIG. 1, the primary pumping arrangement comprises a cryopump 22. An auxiliary exhaust line 24 is provided which is in communication with a roughing pump 26. A pressure gauge 28 is provided to monitor the pressure in chamber 12. A gas inlet system 30 enables a flow of a desired gas, such as nitrogen, to be introduced into the chamber 12.

A controller 32 is provided which controls the loading and unloading of the wafers in a way which is described in more detail below. Conveniently, the control methodologies of the invention can be implemented using software and a suitable microprocessor based device.

Figure 2:
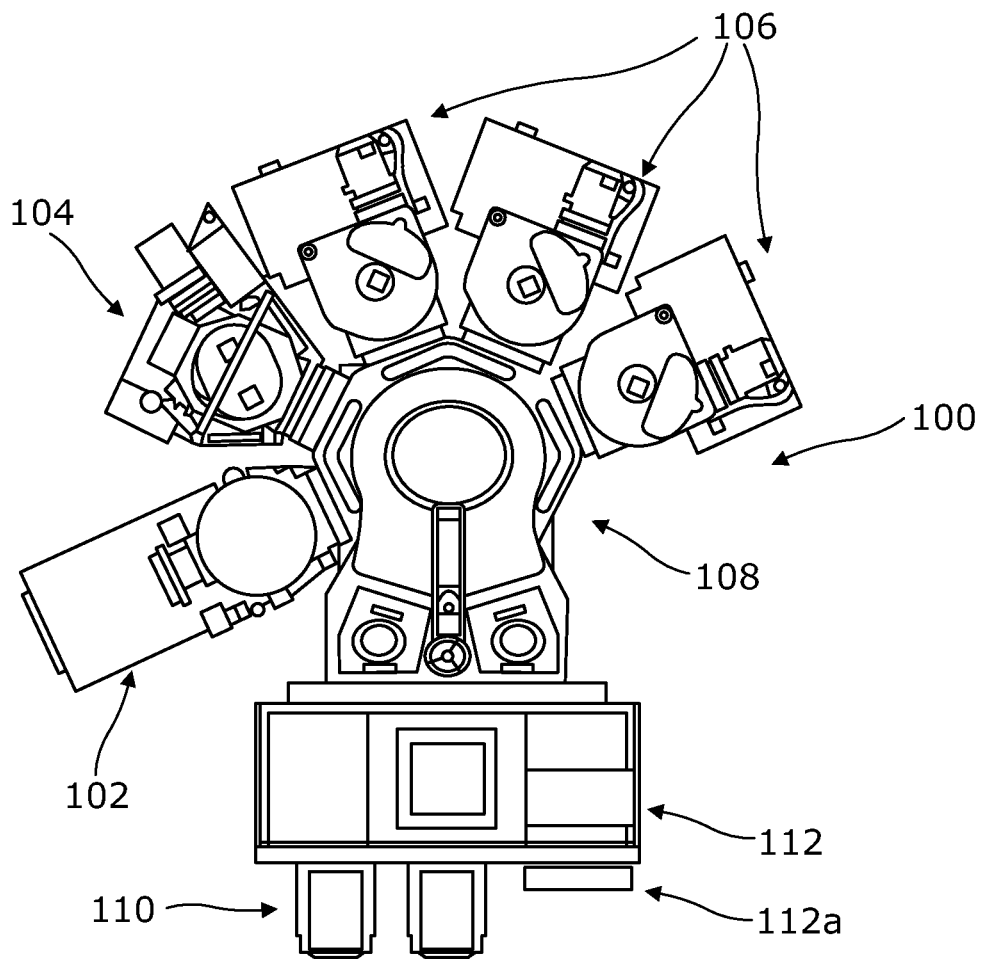
FIG. 2 is a schematic diagram of a cluster tool.

FIG. 2 shows a schematic layout of a PVD cluster tool 100 which comprises a degas module 102 of the invention. The degas module 102 may be of the type described in connection with FIG. 1. The cluster tool 100 further comprises additional modules. The nature of the additional modules depends on the intended end product. In the example shown in FIG. 2, the additional modules comprises a hot soft etch module 104 and three PVD modules 106. The modules 102-106 are distributed around a wafer transport module 108 which transports the wafers to and from the modules 102-106 in accordance with a desired process flow. One of the functions of the wafer transport module 108 is to load and unload wafers into and from the degas module 102 through a slot valve such as the slot valve 14 shown in FIG. 1. Wafers are moved from a FOUP 110 into the cluster tool 100 through small load locks. The cluster tool 100 further comprises a process controller 112. The process controller 112 is provided with a user interface 112a. The process controller 112 controls the operation of the entire cluster tool 100, including the operation of the degas module 102. Thus, the process controller 112 of FIG. 2 can include the functionality of the controller 32 of the embodiment shown in FIG. 1.

Figure 3A:
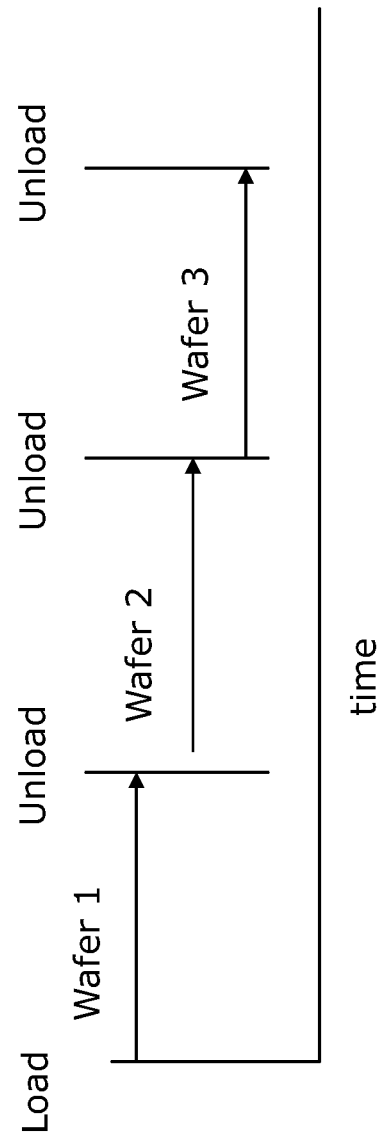
FIGS. 3(a) and 3(b) show wafer degas process sequences for a prior art wafer degas and a wafer degas of the invention, respectively.
Figure 3B:
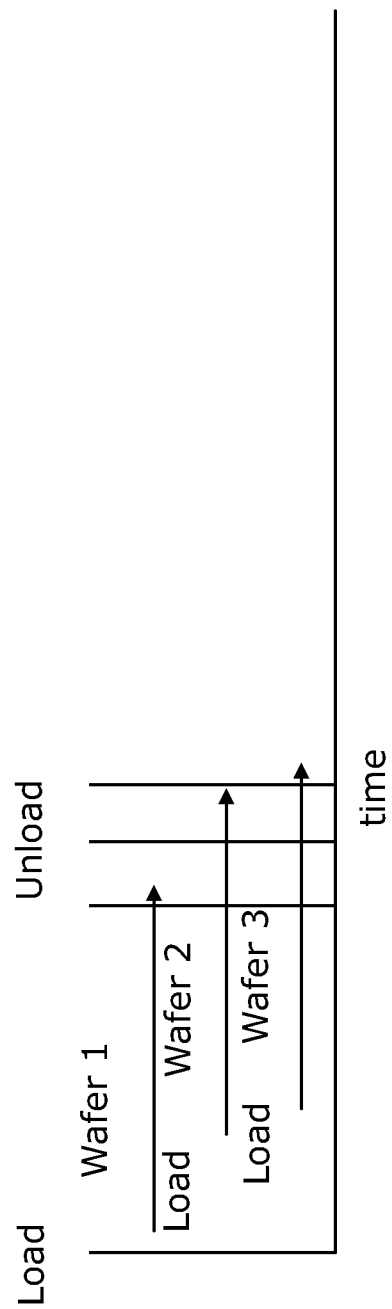

The operation of the degas module 10 of FIG. 1 is now explained in more detail. Semiconductor wafers are sequentially loaded into the module 10 at desired times. The wafers are stored in slots in the wafer holder 16. Each wafer has an individual process timer. A process timer is started as each wafer is loaded into the chamber 12. When a user defined period of time has elapsed, the wafer is considered to be degassed. The degassed wafer then becomes available for unloading from the chamber. The unloaded wafer is then transported within a cluster tool to one or more other modules for further processing. Therefore, the wafers in the chamber 12 can be considered as being degassed in parallel. At any one time there are a plurality of wafers 12 in the chamber 12 undergoing degassing. However, these wafers are loaded at different times and unloaded at different times. Similarly, the degassing process of each wafer begins and ends at a different time. This is in contrast to prior art batch degassing processes. The methodology of the present invention means that the degas module 10 can be continuously loaded and unloaded as and when subsequent process modules become available. By using the degas process module to degas wafers in parallel, a high dynamic throughput can be maintained even if degas times are long. FIG. 3 illustrates the advantages of utilising a degas module in a parallel degassing mode. FIG. 3(a) shows a standard single wafer prior art degas process in which wafers are both loaded and degassed in sequence. For example, wafer 2 is only loaded and degassed after wafer 1 has been degassed and unloaded. With this prior art process, it can be seen that if the wafers 1-3 have long associated degas times, then throughput is severely limited. FIG. 3(b) shows a process in accordance with the invention. Although the wafers 1-3 are loaded sequentially, the associated degassing occurs in parallel. It can be seen that the throughput of the wafers is improved substantially.

The degas module is configured to allow continuous degassing of the wafers to take place in parallel whilst wafers are loaded and unloaded. The process chamber should be of a suitably larger volume that is capable of holding the desired number of wafers and also which is large enough to help ensure that the pressure in the process chamber does not rise significantly during processing. This helps to reduce or prevent contamination. The actual volume of the chamber can be readily selected by the skilled reader, who would appreciate that will depend on factors such as the number and nature of the wafers and the pumping arrangements utilised. In this way it is possible to open and close the slot valve between the chamber and the wafer without introducing contaminants to the rest of the cluster tool. Also, wafers which are partially degassed will not be contaminated when new wafers are loaded into the degas module. Radiative heating of the wafers is advantageous, because it means that there is no requirement to increase chamber pressure in order to achieve effective heating of the wafers.

Figure 4:
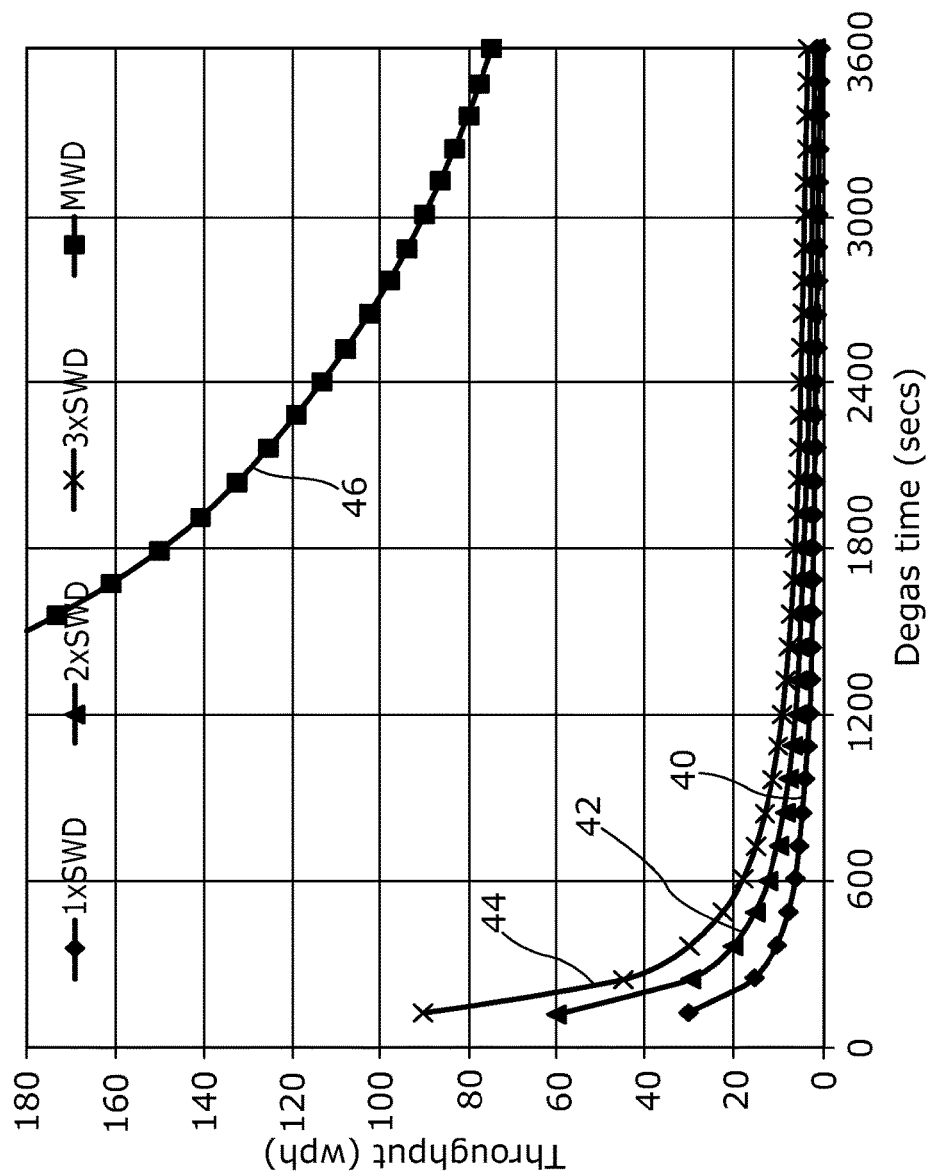
FIG. 4 shows wafer throughput v degas time for various degas apparatus and methodologies.

FIG. 4 shows projected wafer throughputs for an exemplar, nominal 130° C. degas process as a function of degas duration for different degas configurations. The curve 40 represents throughput (wafers per hour) as a function of degas time (seconds) for a single wafer degas (SWD) module. The curves 42, 44 represent throughput as a function of degas time for configurations using two single wafer degas modules and three single wafer degas modules, respectively. The curve 46 shows throughput as a function of degas time for a module of the invention which holds 75 wafers at a time. It can be seen from the curve 40 that a single wafer degas station running a 120 second cycle can achieve a theoretical dynamic throughput of 30 wafers per hour. This drops rapidly with increasing degas time. The use of two or three SWD modules as part of a cluster tool proportionally increases the throughput. However, this is at the considerable additional cost of new modules and requires the utilisation of further cluster tool ports. In contrast, curve 46 shows that the present invention can provide very substantial throughput benefits which can be achieved at all degas times. The substantial throughput benefits are achieved with the use of only a single degas module within a cluster tool.

Figure 5:
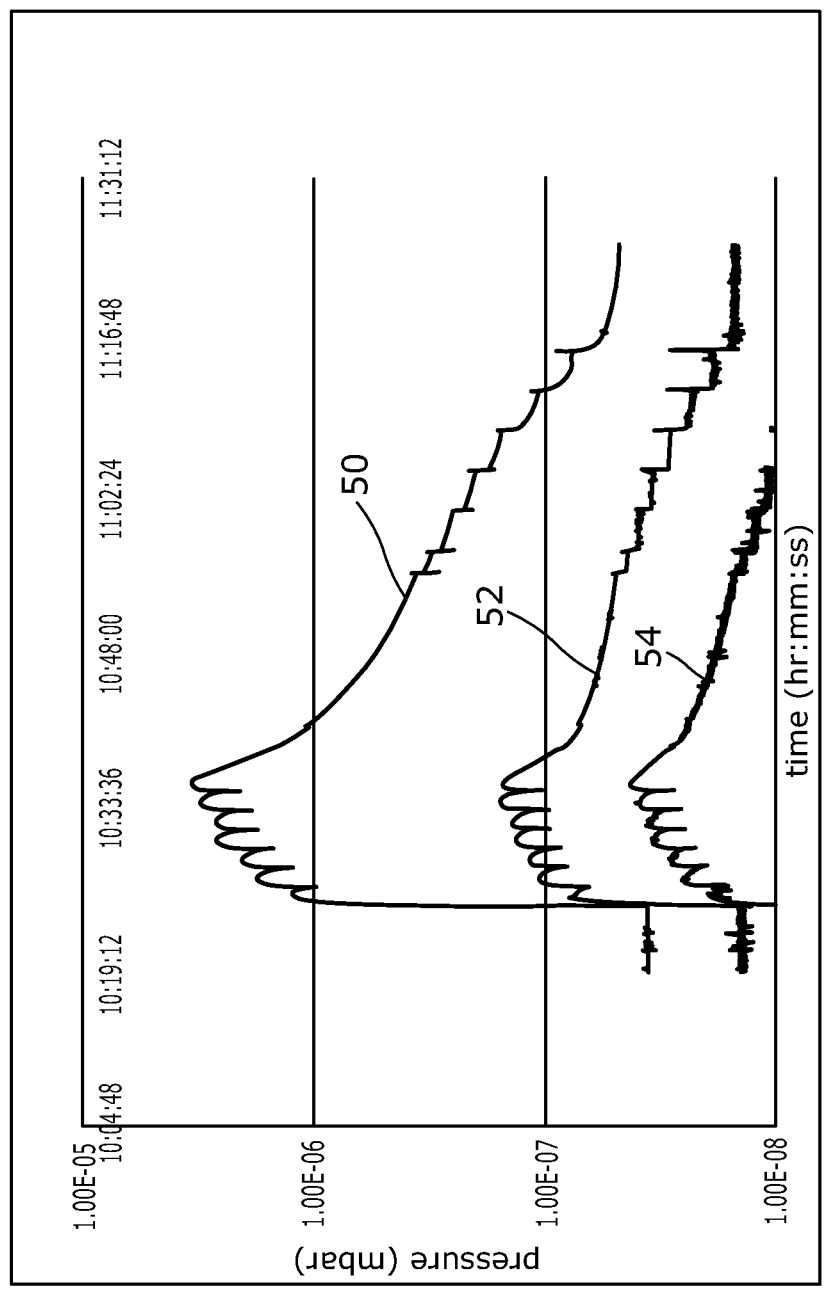
FIG. 5 shows partial pressures of outgassed species.

FIG. 5 shows the partial pressures of certain species associated with outgassing as a function of time. The data obtained using a residual gas analyser (RGA). More specifically, curves 50, 52, 54 show the partial pressures of water, nitrogen and oxygen, respectively. The data are obtained for a 130° C. degas process. It can be seen that a very low pressure is maintained during the degas process with the water peak reaching a maximum pressure of about 4×10-6 mbarr (5.3×10-6 Torr) after about 15 minutes. Due to the excellent vacuum performance of the system even at the peak of this degas process it will be possible to continue to load and unload wafers from the degas module without any detrimental effects to wafers in the module. The relatively low pressure in the degas module also ensures that vacuum level in the transport module will not be compromised which in turn will avoid cross contamination of the other process modules in the cluster tool.

Figure 6:
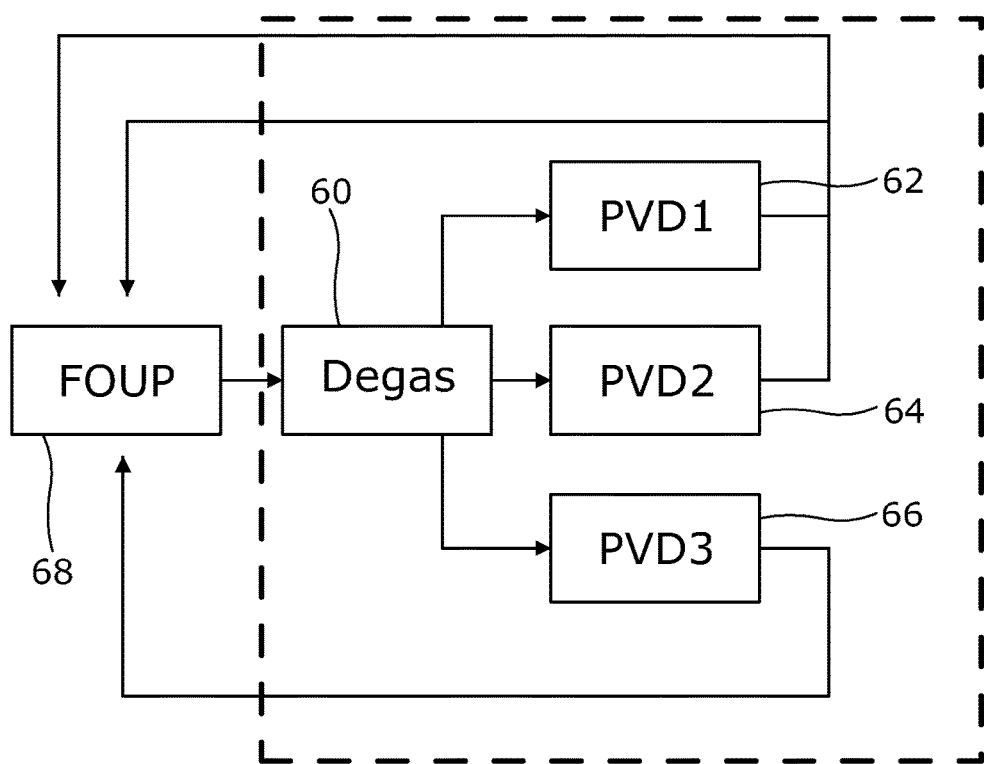
FIG. 6 is a schematic diagram of apparatus used in an exemplar fabrication process utilising a degas module.

FIG. 6 shows a representative two step deposition process comprising a 360 second degas at 130° C. followed by a 120 second PVD deposition step. The process uses a single degas module 60 to supply three PVD modules 62, 64, 66 which run in parallel. A FOUP module 68 is used to transport wafers between the process modules. The degas module 60 can be a prior art SWD module or a degas module of the invention which degasses multiple wafers in parallel. The two step deposition process is simulated for both of these scenarios. With the multiple wafer degas (MWD) module of the invention, the simulation is performed for a degas module having a relatively modest 25 wafer load. The results are shown in Table 1.

TABLE 1

Throughput (wph) for single wafer and multi wafer degas stations in representative process sequence

| Degas Module Type | Static Throughput (wafers per hour) |
|---|---|
| SWD | 9.2 |
| MWD (25 wafers) | 38.4 |

With the single wafer degas module, there is a mismatch in residence times. More specifically, the degas time is 360 seconds whereas each of the PVD modules has a process time of 120 seconds. This mismatch has the consequence that the system cannot function efficiently. As a result, the projected throughput for this configuration is 9.2 wafers per hour (wph). In contrast, the multiple wafer deposition module of the invention which handles 25 wafers enables the apparent throughput limitation caused by the length of the degas time to be removed. Because the wafers are degassed in parallel, full use is made of the three PVD modules which are configured in parallel. This results in a throughput of 38.4 wph. Procedural programming techniques can ensure that the wafers are processed in the shortest time possible.

What is claimed is:

1. A method of degassing semiconductor substrates comprising:
   sequentially loading a plurality of semiconductor substrates into a degas apparatus;
   degassing the semiconductor substrates in parallel, the degassing of each semiconductor substrate commencing at a different time related to the time at which the semiconductor substrate was loaded into the degas apparatus; and
   unloading a semiconductor substrate from the degas apparatus when the semiconductor substrate has been degassed, while semiconductor substrates which were loaded later in the sequence are still being degassed;
   in which the degassing of the semiconductor substrates is performed at pressure of less than $10^{-4}$ Torr, and the degas apparatus is pumped continuously during the degassing of the semiconductor substrates.

2. A method according to claim 1 in which the degassing of the semiconductor substrates is performed at a pressure of less than $5 \times 10^{-5}$ Torr.

3. A method according to claim 1 in which the degassing comprises radiatively heating the semiconductor substrates.

4. A method according to claim 1 in which each semiconductor substrate is degassed for a predetermined amount of time prior to unloading.

5. A method according to claim 1 in which at least three semiconductor substrates are sequentially loaded into the degas apparatus.

6. A method according to claim 1 in which at least 20 semiconductor substrates are sequentially loaded into the degas apparatus.

7. A method according to claim 1 in which at least 50 semiconductor substrates are sequentially loaded into the degas apparatus.

8. A method of degassing semiconductor substrates comprising:
   sequentially loading semiconductor substrates into a chamber of a degas apparatus, whereby semiconductor substrates accumulate in the chamber;
   establishing a process recipe of conditions within the chamber that effect a degassing of any of the semiconductor substrates in the chamber including as others of the substrates are being sequentially loaded into the chamber such that semiconductor substrates are degassed in parallel with the degassing of each semiconductor substrate loaded into the chamber subsequently to another of the semiconductor substrates commencing at a point in time later than that at which said another semiconductor substrate was loaded into the processing chamber; and
   after each respective one of the semiconductor substrates has been degassed in the chamber, unloading the respective semiconductor substrate from the chamber while semiconductor substrates which were loaded into the chamber subsequent to the respective semiconductor substrate remain under said conditions of the process recipe so that they continue to be degassed in the process chamber during said unloading,
   wherein the establishing of a process recipe of conditions within the chamber to effect the degassing comprises regulating the pressure in the process chamber to be less than $10^{-4}$ Torr while pumping gas from the chamber continuously during the degassing of the semiconductor substrates situated in the chamber.

9. A method according to claim 8 in which the establishing of a process recipe of conditions within the chamber to effect the degassing comprises regulating the pressure in the process chamber to be less than $5 \times 10^{-5}$ Torr.

10. A method according to claim 8 in which the establishing of a process recipe of conditions within the chamber to effect the degassing comprises radiantly heating the semiconductor substrates.

11. A method according to claim 8 in which each of the semiconductor substrates is unloaded from the chamber after a period of time has elapsed since the semiconductor substrate was loaded into the chamber, and said period of time is the same for each of the plurality of semiconductor substrates such that each the semiconductors substrates is degassed for the same amount of time in the chamber.

12. A method according to claim 8 in which at least 20 semiconductor substrates are sequentially loaded into the chamber before any of the 20 semiconductor substrates are unloaded from the chamber.

13. A method according to claim 8 in which at least 50 semiconductor substrates are sequentially loaded into the chamber before any of the 50 semiconductor substrates are unloaded from the chamber.

* * * * *